United States Patent
Lee et al.

(10) Patent No.: US 12,182,486 B2
(45) Date of Patent: Dec. 31, 2024

(54) SYSTEM AND METHOD FOR MODELING DAMAGES CAUSED BY INCIDENT PARTICLES

(71) Applicant: Samsung Electronics Co., Ltd., Suwon-si (KR)

(72) Inventors: Sangwoon Lee, Seoul (KR); Joohyun Jeon, Hwaseong-si (KR); Sungjin Kim, Hwaseong-si (KR); Seunghyun Kim, Seoul (KR); Wonki Roh, Yongin-si (KR); Chulwoo Park, Seoul (KR); Seongjae Byeon, Hwaseong-si (KR); Taeyoon An, Hwaseong-si (KR); Hyoeun Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 740 days.

(21) Appl. No.: 17/491,739

(22) Filed: Oct. 1, 2021

(65) Prior Publication Data
US 2022/0309216 A1    Sep. 29, 2022

(30) Foreign Application Priority Data
Mar. 26, 2021    (KR) .................. 10-2021-0039838

(51) Int. Cl.
*G06F 30/3308* (2020.01)
*G06F 30/25* (2020.01)

(52) U.S. Cl.
CPC .......... *G06F 30/3308* (2020.01); *G06F 30/25* (2020.01)

(58) Field of Classification Search
CPC ...... G06F 30/3308; G06F 30/33; G06F 30/25; G06F 30/20; G06F 30/23
See application file for complete search history.

(56) References Cited

U.S. PATENT DOCUMENTS

| | | | |
|---|---|---|---|
| 5,819,073 A | 10/1998 | Nakamura | |
| 7,523,422 B2 | 4/2009 | Zhu et al. | |
| 7,653,890 B2 * | 1/2010 | Tsai | G03F 1/36 |
| | | | 716/54 |
| 10,410,862 B2 | 9/2019 | Terterian et al. | |
| 10,606,968 B2 | 3/2020 | Moroz et al. | |

(Continued)

FOREIGN PATENT DOCUMENTS

CN    106682319 A    5/2017

OTHER PUBLICATIONS

Charlo, J.C.P., 2016. Role of interface configuration in diamond-related power devices (Doctoral dissertation, Universidad de Cádiz). (Year: 2016).*

(Continued)

*Primary Examiner* — Chuen-Meei Gan
(74) *Attorney, Agent, or Firm* — MORGAN, LEWIS & BOCKIUS LLP

(57) ABSTRACT

A method of modeling damages to a crystal caused by an incident particle includes obtaining particle information and crystal information; estimating energy loss of the incident particle based on the particle information and the crystal information; estimating a volume of a vacancy based on the energy loss; estimating a vacancy reaction based on the crystal information and the volume of the vacancy; and generating output data based on the vacancy reaction, the output data including quantification data of the damages.

20 Claims, 11 Drawing Sheets

(56) References Cited

U.S. PATENT DOCUMENTS

2013/0133832 A1    5/2013  Kuboi et al.
2018/0117577 A1*   5/2018  Nagpal ................ B01J 27/0573
2018/0129765 A1    5/2018  Stokbro et al.

OTHER PUBLICATIONS

'Soft Error Simulations' *The Simulation Standard*, a Journal for Process and Device Engineers, vol. 26, No. 2, Apr., May, Jun. 2016, pp. 1-13.
J. Autran et al. 'Soft-Error Rate of Advanced SRAM Memories: Modeling and Monte Carlo Simulation' *INTECH*, Numerical Simulation—From Theory to Industry, Chapter 15, pp. 309-336 (2012).

* cited by examiner

SYSTEM AND METHOD FOR MODELING DAMAGES CAUSED BY INCIDENT PARTICLES

CROSS-REFERENCE TO RELATED APPLICATION

This application is based on and claims priority under 35 U.S.C. § 119 to Korean Patent Application No. 10-2021-0039838, filed on Mar. 26, 2021, in the Korean Intellectual Property Office, the disclosure of which is incorporated by reference herein in its entirety.

BACKGROUND

Inventive concepts relate to simulations, and more particularly, to a system and/or method for modeling damages caused by incident particles.

Particles incident onto an integrated circuit fabricated through semiconductor processes may cause various problems in the integrated circuit. For example, when the electrical state of an element of the integrated circuit is changed by an incident particle incident onto the integrated circuit, an error (e.g., a soft error) may occur in the operation of the integrated circuit, the performance of the integrated circuit may be deteriorated, and/or the integrated circuit may be eventually damaged. Particles incident onto an integrated circuit may be caused by cosmic rays. Particles having higher energy at high altitudes, e.g., in airplanes flying in the troposphere, may become incident onto an integrated circuit. Therefore, to design integrated circuits having a structure for preventing or reducing the likelihood of and/or impact of damages caused by incident particles thereon, it may be desired to accurately estimate damages that may occur in an integrated circuit due to particles having high energy.

SUMMARY

Inventive concepts provide a system for and method of more accurately and/or more efficiently modeling damages from incident particles.

According to some example embodiments of inventive concepts, there is provided a method of modeling damages to a crystal caused by an incident particle. The method includes obtaining particle information and crystal information, estimating energy loss of the incident particle based on the particle information and on the crystal information, estimating a volume of a vacancy based on the energy loss, estimating a vacancy reaction based on the crystal information and on the volume of the vacancy, and generating output data based on the vacancy reaction, the output data including quantification data of the damages.

According to some example embodiments of inventive concepts, there is provided a system including at least one processor, and a non-transitory storage medium storing instructions that, when executed by the at least one processor, cause the at least one processor to model damages to a crystal caused by an incident particle. The operations include an operation of obtaining particle information and crystal information, an operation of estimating energy loss of the incident particle based on the particle information and the crystal information, an operation of estimating a volume of a vacancy based on the energy loss, an operation of estimating a vacancy reaction based on the crystal information and on the volume of the vacancy, and an operation of generating output data based on the vacancy reaction, the output data including quantification data of the damages.

According to some example embodiments of inventive concepts, there is provided a non-transitory storage medium storing instructions that, when executed by at least one processor, cause the at least one processor to model damages to a crystal caused by an incident particle. The operations include an operation of obtaining particle information and crystal information, an operation of estimating energy loss of the incident particle based on the particle information and the crystal information, an operation of estimating a volume of a vacancy based on the energy loss, an operation of estimating a vacancy reaction based on the crystal information and the volume of the vacancy, and an operation of generating output data based on the vacancy reaction, the output data including quantification data of the damages.

According to some example embodiments of inventive concepts, there is provided a method of modeling damages to a crystal caused by an incident particle. The method includes obtaining particle information and crystal information, estimating energy loss of the incident particle based on the particle information and on the crystal information, and estimating a volume of a vacancy based on the energy loss, The estimating of the volume of the vacancy includes estimating a first volume of the vacancy caused by the energy loss, estimating a second volume caused by diffusion of the vacancy, and calculating the volume of the vacancy by summing the first volume and the second volume.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF EXAMPLE EMBODIMENTS

Figure 1:
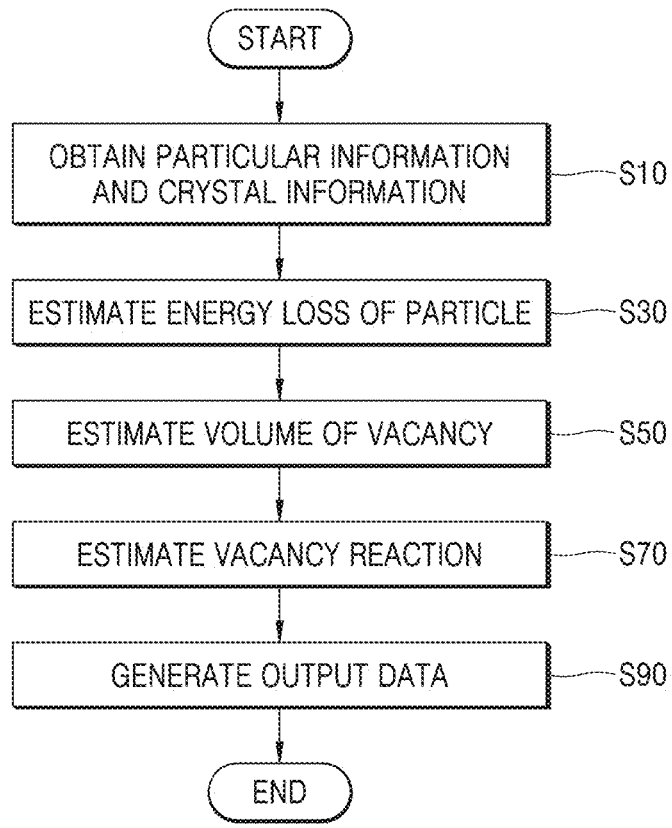
FIG. 1 is a flowchart of a method of modeling damages caused by incident particles, according to some example embodiments.

FIG. 1 is a flowchart of a method of modeling damages caused by incident particles, according to some example embodiments. The method of modeling damages caused by incident particles may be performed by a computing system (e.g., a computing system 130 of FIG. 13). Hereinafter, descriptions will be focused on damages, e.g. hard and/or soft errors, occurring in integrated circuits due to incident particles, which are manufactured by semiconductor processes, but example embodiments may also be applied to any objects that may be damaged by incident particles, as well as integrated circuits.

The operations of methods described below may be performed by appropriate units that may perform the operations, e.g., various hardware and/or software components, circuits, and/or modules. Software may include an ordered list of executable instructions for realizing logical functions and may be used by an instruction execution system and/or device (e.g., a single- or multi-core processor or a system including a processor) and/or embodied in any relevant processor-readable medium.

The steps or blocks and functions of a method or algorithm described below may be embodied directly in hardware, a software module executed by a processor, and/or a combination thereof. When functions are implemented by software, the functions may be stored as at least one instruction or code in a non-transitory tangible computer-readable medium. A software module may reside in any one of or more than one of a random access memory (RAM), flash memory, read-only memory (ROM), electrically programmable ROM (EPROM), electrically erasable programmable ROM (EEPROM), registers, a hard disk, a removable disk, a CD-ROM, or any other form of storage medium.

Particles incident to an integrated circuit may be produced by various causes. For example, various particles may be incident to an integrated circuit because of cosmic rays, which refer to high-energy particles and radiation that are coming in from space, radiation produced during radioactive decay of a substance, and/or the like. As described below with reference to FIGS. 2A through 2C, an incident particle may cause the electrical state of an integrated circuit to change, and accordingly, various problems may occur in the integrated circuit. Herein, an integrated circuit may refer to any object that is manufactured by semiconductor processes. For example, an integrated circuit may be or may include a memory device such as dynamic RAM (DRAM) or flash memory, a programmable device such as a central processing unit (CPU), a fixed function device such as an intellectual property (IP) core, a reconfigurable device such as a field programmable gate array (FPGA), or a combination thereof.

An integrated circuit may be manufactured by semiconductor processes including various sub-processes. For a high integration density and/or performance, an integrated circuit may have a complex structure, and elements of the integrated circuit may have reduced dimensions. Accordingly, elements of an integrated circuit may be sensitive to incident particles, and incident particles may cause temporary errors and/or permanent damage. As described below with reference to the accompanying drawings, damages caused by incident particles may be accurately or more accurately modeled, and damages caused by incident particles under various conditions may be easily or more easily modeled. Therefore, a structure for preventing or reducing the likelihood of and/or impact from damages caused by incident particles may be more easily designed, and/or an integrated circuit robust to incident particles may be obtained. As shown in FIG. 1, the method of modeling damages caused by incident particles may include a plurality of operations S10, S30, S50, S70, and S90.

Referring to FIG. 1, particle information and crystal information may be obtained in operation S10. Particle information and crystal information may be obtained in a computing system using a particular method or an arbitrary method. For example, particle information and crystal information may be loaded from a storage to a memory of a computing system, received by a computing system through a network, and/or input to a computing system through an input device.

Particle information is or includes information about particles incident to an integrated circuit, and may include information about energy and/or incident angles of particles. The energy and incident angles of particles may depend on a surrounding (e.g., the ground, a flying airplane, or an orbiting satellite) of an integrated circuit, along with the type of particles. In some example embodiments, the incident angle of particles may be calculated based on the type and/or energy of the particles. An example of particle information will be described with reference to FIG. 3A.

Crystal information may include information about a crystal, such as a semiconductor substrate grown with a Czochralski process and/or an epitaxially-grown crystal layer and/or a polycrystalline layer, included in an integrated circuit. As described above, a particle incident to an integrated circuit may cause not only a temporary error, e.g. a soft error, but also permanent damage, e.g. a hard error. Displacement damage is an example of permanent damage and may refer to damage, which causes a lattice defect because atoms of a crystal are displaced by an incident particle (and/or a secondary particle depending on or emitted from an incident particle). The crystal information may be used to estimate displacement damage and may include information about a crystalline portion (e.g., the volume and/or shape of a crystalline portion) and/or information about a unit cell of lattice (e.g., the size of a unit cell or information about an atom, ion, and/or molecule of a unit cell).

The energy loss of a particle may be estimated in operation S30. A particle incident to an integrated circuit may collide with an atom, and energy lost in the particle may determine the level displacement damage. For example, assuming that an incident particle and an atom respectively have energy $E_1$ and energy $E_2$ after the incident particle collides with the atom of a crystal, when the energy $E_2$ of the atom is greater than displacement energy $E_d$ (e.g., $E_2 > E_d$), the atom may be displaced. For example, the atom may be knocked or moved out from the lattice. Furthermore, when the energy $E_1$ of the incident particle is greater than the displacement energy $E_d$ and the energy $E_2$ of the atom is greater than the displacement energy $E_d$ (e.g., $E_1 > E_d$ and $E_2 > E_d$), a vacancy may be formed. Furthermore, when the energy $E_1$ of the incident particle is less than the displacement energy $E_d$ and the energy $E_2$ of the atom is greater than the displacement energy $E_d$ (i.e., $E_1 < E_d$ and $E_2 > E_d$), an interstitial may be formed, e.g. the atom may be interstitial within the lattice. The energy loss of the particle may be estimated based on the particle information and the crystal information, which have been obtained in operation S10, and/or based on a physical model of collision between an incident particle and an atom.

The volume of a vacancy may be estimated in operation S50. As described above, the vacancy may be formed due to the incident particle and may change the electrical characteristics of a crystalline portion. For example, the crystalline portion may be doped during a semiconductor process, and the vacancy caused by the incident particle may change the dopant concentration of the crystalline portion. The change of the dopant concentration may lead to a change in the characteristics of an element, e.g., of a transistor, of the integrated circuit and may eventually affect the operation of the integrated circuit. Therefore, it may be required or desired to accurately or more accurately estimate the volume of the vacancy caused by the incident particle, and the volume of the vacancy may be estimated based on the energy loss estimated in operation S30. An example of operation S50 will be described with reference to FIG. 5.

A vacancy reaction may be estimated in operation S70. As described above, the incident particle may cause the vacancy, and the vacancy may react with a dopant and/or an impurity. The reaction between the vacancy and the dopant and/or the impurity may depend on the volume of the vacancy, and on a crystal characteristic, and accordingly, the vacancy reaction may be estimated based on the crystal information obtained in operation S10 and the volume of the vacancy estimated in operation S50. Examples of operation S70 will be described with reference to FIGS. 6 through 9.

Output data may be generated in operation S90. The output data may represent a changed state of the crystalline portion according to the vacancy reaction estimated in operation S70. The output data may represent the vulnerability (and/or the robustness) of the integrated circuit against the incident particle and may be used to verify or support the verification of the design of an integrated circuit. Accordingly, as described below with reference to FIG. 12, a design period for an integrated circuit may be reduced, and/or the yield of the integrated circuit may be increased because the integrated circuit is manufactured to be robust to incident particles. An example of the output data will be described with reference to FIG. 11.

Figure 2A:
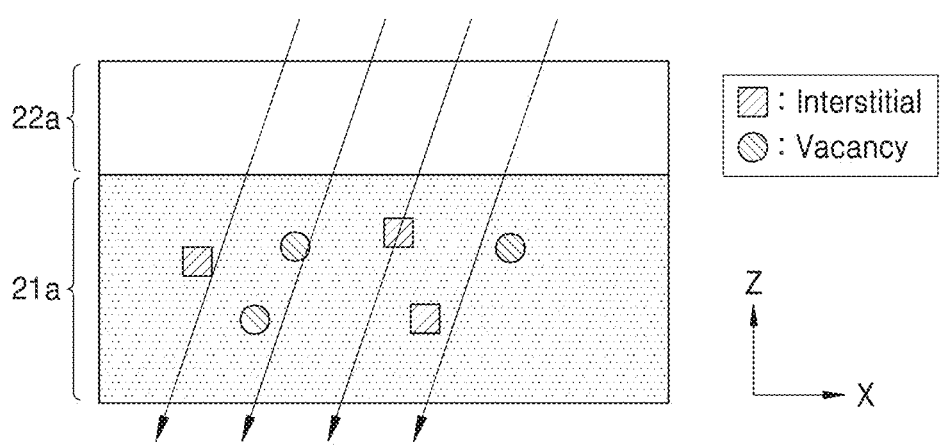
FIGS. 2A through 2C are cross-sectional views of phenomena occurring in an integrated circuit due to incident particles.
Figure 2B:
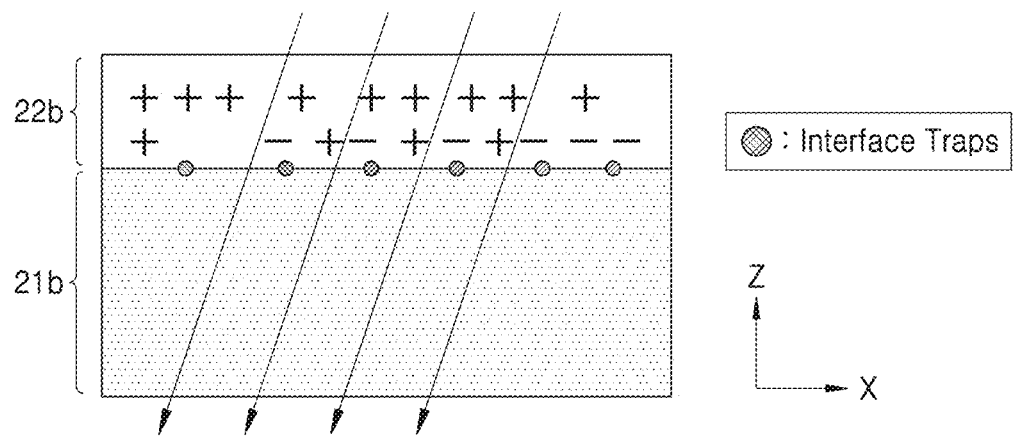
Figure 2C:
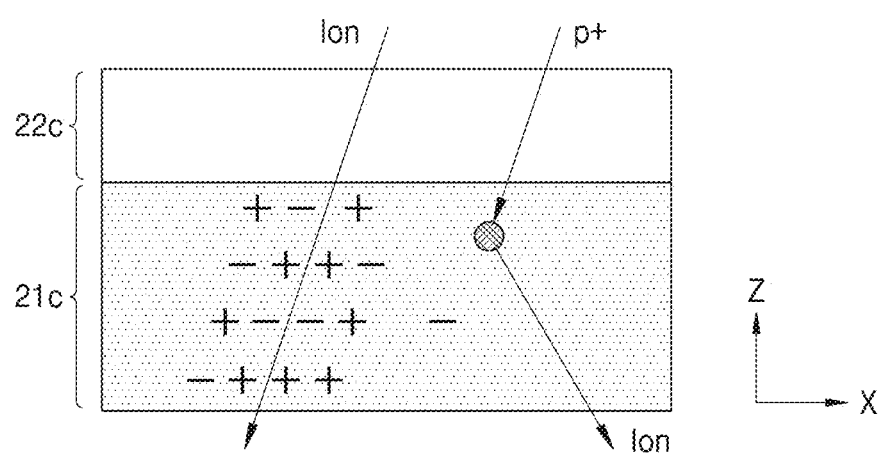

FIGS. 2A through 2C are cross-sectional views illustrating phenomena occurring in an integrated circuit due to incident particles. In detail, the cross-sectional views of FIGS. 2A through 2C respectively show phenomena occurring when particles are incident to amorphous layers 22a, 22b, and 22c in respective stack structures of a crystalline layer 21a and the amorphous layer 22a, a crystalline layer 21b and the amorphous layer 22b, and a crystalline layer 21c and the amorphous layer 22c. In some example embodiments, the crystalline layers 21a, 21b, and 21c may include doped silicon layers such as doped single-crystal silicon layers corresponding to channel regions and/or source/drain regions of a transistor, and the amorphous layers 22a, 22b, and 22c may include oxide layers such as an interlayer dielectric layer and/or a gate oxide layer of a transistor.

Herein, an X-axis direction and a Y-axis direction may be respectively referred to as a first horizontal direction and a second horizontal direction, and a Z-axis direction may be referred to as a vertical direction. A plane defined by an X-axis and a Y-axis may be referred to as a horizontal plane. An element positioned in a +Z direction compared to another element may be considered as being above the other element. An element positioned in a −Z direction compared to another element may be considered as being below the other element. The area of an element may refer to a size occupied by the element in a plane parallel with the horizontal plane, and the height of the element may refer to a length of the element in the Z-axis direction.

Referring to FIG. 2A, displacement damage may occur in an integrated circuit because of incident particles. For example, as shown in FIG. 2A, when high-energy protons, electrons, and/or ions pass through the amorphous layer 22a and the crystalline layer 21a, vacancies and/or interstitials may be formed. Differently from a single event effect (SEE) described below with reference to FIG. 2C, vacancies and/or interstitials resulting from displacement damage may remain in the crystalline layer 21a, and accordingly, an electrical characteristic (e.g., a dopant concentration) of the crystalline layer 21a may be changed, e.g. may be permanently changed.

Referring to FIG. 2B, total ionizing dose (TID) effects may occur in an integrated circuit because of incident particles. For example, as shown in FIG. 2B, when high-energy protons, electrons, and/or ions pass through the amorphous layer 22b and the crystalline layer 21b, electrons and holes may be formed in an interface between the crystalline layer 21b and the amorphous layer 22b, and an interface trap may be generated. TID effects may change certain electrical characteristics such as the threshold voltage of a field effect transistor (FET) and/or may increase the leakage current of the FET. Alternatively or additionally, the TID effects may reduce the current gain of a bipolar junction transistor and may not extinct.

Referring to FIG. 2C, the SEE may occur in an integrated circuit because of incident particles. For example, as shown in FIG. 2C, when high-energy ions pass through the amorphous layer 22c and the crystalline layer 21c, ionization (impact ionization) may occur in the crystalline layer 21c. When high-energy protons pass through the amorphous layer 22c and reach the crystalline layer 21c, a high-energy ion may be created in the crystalline layer 21c. The SEE may change an electrical signal generated by the integrated circuit, and accordingly, an error, e.g., a soft error, may occur in the operation of the integrated circuit.

As described above, the vacancies and the interstitials caused by displacement damage in FIG. 2A may remain in the crystalline layer 21a, and accordingly, the integrated circuit having the displacement damage may not provide designed performance or may not operate normally. For example, when an integrated circuit fabricated semiconductor processes is transported by air, high-energy particles such as alpha particles (helium ions) and/or beta particles (electrons) and/or neutrons may be incident to the integrated circuit in a flying airplane. The integrated circuit may be included on a substrate such as on a wafer. The wafer may or may not be passivated. Alternatively the integrated circuit may be packaged. Therefore, to detect defects caused by displacement damage, the integrated circuit may be tested at arrival, and this test may be costly. As described below with reference to the accompanying drawing, displacement damage to an integrated circuit because of incident particle may be more accurately modeled, and accordingly, an integrated circuit robust to displacement damage may be easily designed.

Figure 3A:
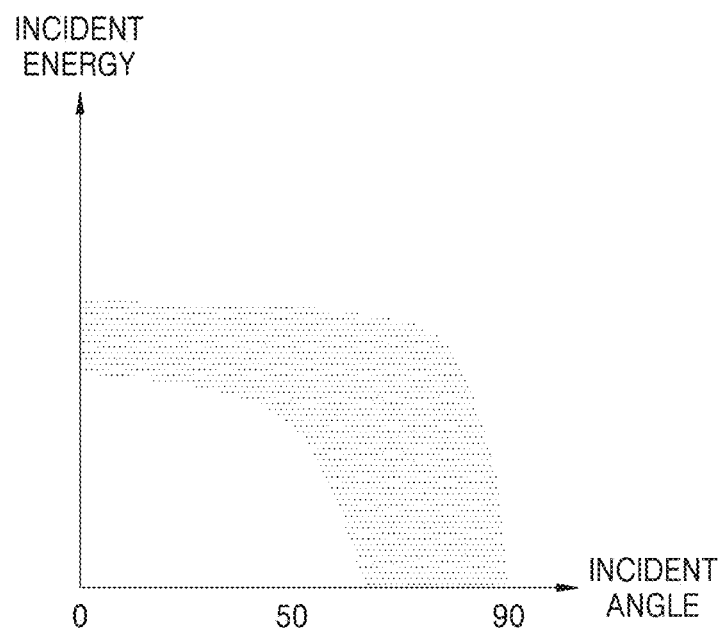
FIGS. 3A and 3B are diagrams of examples of particle information according to example embodiments.
Figure 3B:
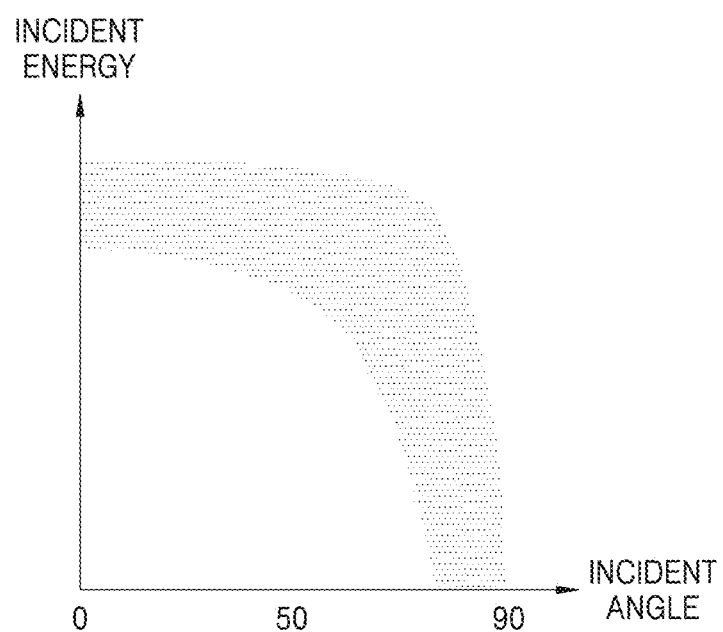

FIGS. 3A and 3B are diagrams of examples of particle information according to example embodiments. In detail, FIGS. 3A and 3B are respectively a graph corresponding to lithium (Li) and a graph corresponding to helium (He). As described above with reference to FIG. 1, particle information may be used together with crystal information to estimate damages caused by incident particles.

In some example embodiments, the particle information may include information about incident energy and an incident angle. For example, as shown in FIGS. 3A and 3B, the distribution of particles with respect to incident energy and incident angles may be used as the particle information. Particles having an incident angle of about 0 degrees may have relatively similar incident energy levels, whereas particles having an incident angle of about 90 degrees may have relatively various or dissimilar energy levels. The incident energy and incident angles of particles may depend on surroundings and the type of particles. For example, as shown in FIGS. 3A and 3B, Li may have relatively lower incident energy than He.

Figure 4:
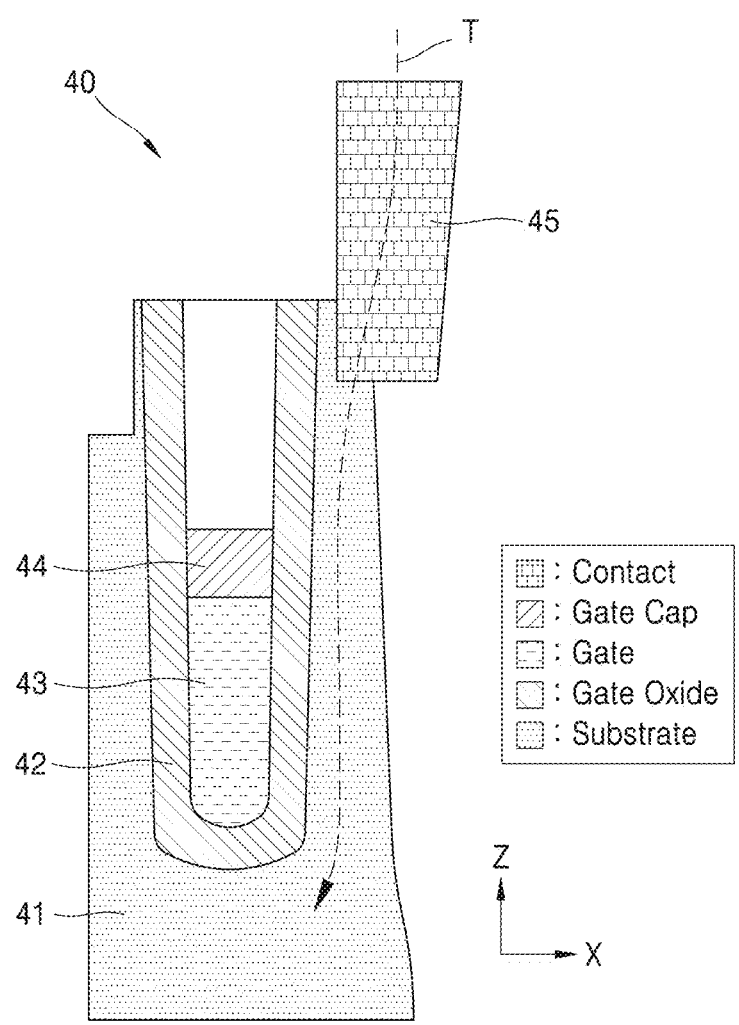
FIG. 4 is a cross-sectional view of an integrated circuit according to some example embodiments.

FIG. 4 is a cross-sectional view of an integrated circuit 40 according to some example embodiments. In detail, the cross-sectional view of FIG. 4 shows a buried channel array transistor (BCAT) included in the integrated circuit 40. The BCAT may be included in a DRAM device. Example embodiments are not limited to DRAM devices, nor are they limited to a BCAT device.

The structure of the integrated circuit 40 may be defined by the design data of the integrated circuit 40. The design data may be used for technology computer aided design (TCAD) using computer simulations to develop and improve or optimize semiconductor process technologies and devices. The design data may include information about the shapes of structures included in the integrated circuit 40 and/or information about features (e.g., a composition) of each structure. In some example embodiments, the crystal information used to estimate damages caused by incident particles in FIG. 1 may be extracted from the design data of the integrated circuit 40 and may include information about the shape and/or composition of a crystalline portion of the integrated circuit 40. The crystal information may further include information about a state, e.g., temperature, of the integrated circuit 40.

Referring to FIG. 4, a trench may be formed in a substrate 41, and an oxide layer (e.g. a gate oxide layer) 42 may be formed in the trench. The substrate 41 may be or may include single-crystal silicon, and the oxide layer 42 may be or may include silicon-oxide (SiO2). A gate 43 and a gate capping layer 44 may be sequentially formed on the oxide layer 42. A portion of the substrate 41 adjacent to each side surface of the trench may be doped with a dopant such as at least one of boron, phosphorus, or arsenic, and accordingly, a source and a drain of a transistor may be respectively formed at opposite sides of the trench. A contact 45 may be connected to the source or the drain and referred to as a global buried contact (GBC).

When a particle incident to the integrated circuit 40 moves along a path or a track T in FIG. 4, the electrical state of each portion of the integrated circuit 40 may be changed by the incident particle. For example, a Schottky barrier height (SBH) may be changed in an upper interface of the contact 45, and deactivation of the dopant (e.g., of phosphorous (P) and/or of arsenic (As)) may occur in the contact 45 and the substrate 41. The deactivation of the dopant may change the doping concentrations of the contact 45 and the substrate 41, and may eventually change electrical characteristics (e.g., resistance) of the contact 45 and the substrate 41. Descriptions below will be focused on the integrated circuit 40, but example embodiments are not limited thereto. Furthermore, although the track T of an incident particle is illustrated as incident onto the contact 45, example embodiments are not limited thereto.

Figure 5:
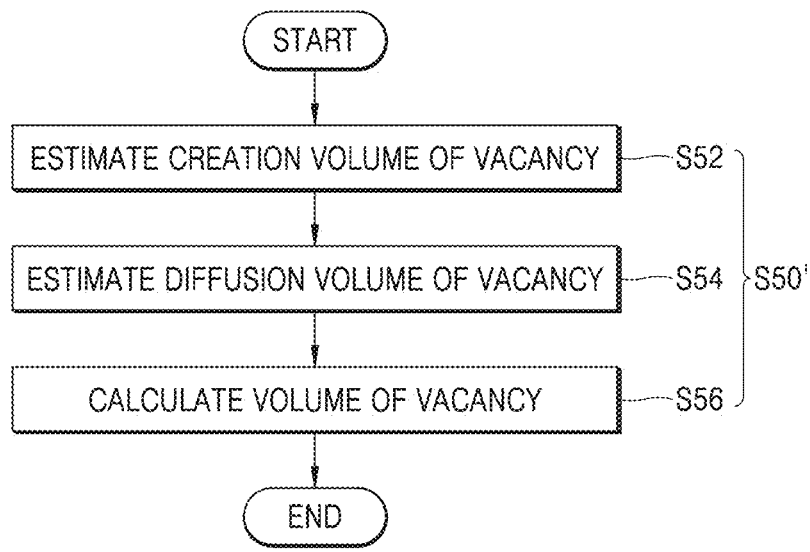
FIG. 5 is a flowchart of a method of modeling damages caused by incident particles, according to some example embodiments.

FIG. 5 is a flowchart of a method of modeling damages caused by incident particles, according to some example embodiments. In detail, the flowchart of FIG. 5 is an example of operation S50 in FIG. 1. As described above with reference to FIG. 1, the volume of a vacancy may be estimated in operation S50' of FIG. 5. As shown in FIG. 5, operation S50' may include a plurality of operations S52, S54, and S56. FIG. 5 is described with reference to FIG. 1.

Referring to FIG. 5, a creation volume of the vacancy may be estimated in operation S52. As described above with reference to FIG. 1, the vacancy may be formed by or because of the energy of the incident particle. For example, the higher the energy of the incident particle, the energy loss of the incident particle and the creation volume of the vacancy may increase. In some example embodiments, the creation volume of the vacancy may be calculated based on a polynomial of the energy loss of the incident particle. For example, when the energy loss of the incident particle is estimated as E in operation S30 in FIG. 1, the creation volume of the vacancy, e.g., $Vol_{creation}$, may be calculated using Equation 1.

$$Vol_{creation}(E)=aE^3+bE^2+cE \qquad \text{[Equation 1]}$$

In Equation 1, coefficients "a", "b", and "c" may be determined based on the particle information and on the crystal information. Herein, the creation volume of a vacancy may be referred to as a first volume.

A diffusion volume of the vacancy may be estimated in operation S54. The vacancy created due to incident particle may be diffused in a crystalline portion, and accordingly, the diffusion volume of the vacancy may also be estimated. In some example embodiments, the diffusion volume of the vacancy may be calculated based on the diffusivity of the vacancy and/or the lifetime of the vacancy. For example, the diffusion volume of the vacancy, e.g., $Vol_{diffusion}$, may be calculated using Equation 2.

$$Vol_{diffusion}(\tau_{lifetime})=A\times(\sqrt{D_V\times\tau_{lifetime}})^3 \qquad \text{[Equation 2]}$$

In Equation 2, $\tau_{lifetime}$ may be the lifetime of the vacancy, and $D_V$ may be the diffusivity of the vacancy. Coefficient A may be determined based on the particle information and the crystal information. Herein, the diffusion volume of a vacancy may be referred to as a second volume.

The volume of the vacancy may be calculated in operation S56. In some example embodiments, the volume of a vacancy caused by an incident particle may be calculated based on a creation volume and a diffusion volume of the vacancy. For example, the volume of the vacancy, e.g., $Vol_{vacancy}$, may be calculated as the sum of the creation volume, $Vol_{creation}$, and the diffusion volume, $Vol_{diffusion}$, of the vacancy, as shown in Equation 3.

$$Vol_{vacancy}=Vol_{creation}+Vol_{diffusion} \qquad \text{[Equation 3]}$$

In some example embodiments, the creation volume $Vol_{creation}$ in Equation 3 may be calculated using Equation 1, and the diffusion volume $Vol_{diffusion}$ in Equation 3 may be calculated using Equation 2. Herein, the volume of a vacancy may be referred to as a damage volume and/or a resultant volume of the vacancy.

Figure 6:
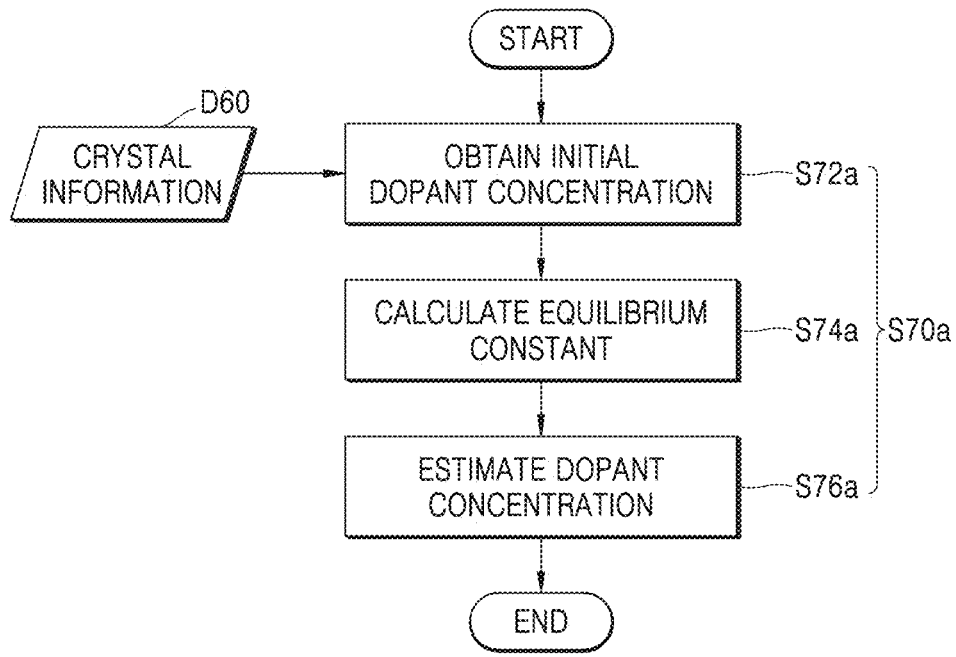
FIG. 6 is a flowchart of a method of modeling damages caused by incident particles, according to some example embodiments.

FIG. 6 is a flowchart of a method of modeling damages caused by incident particles, according to some example embodiments. In detail, the flowchart of FIG. 6 is an example of operation S70 in FIG. 1. As described above with reference to FIG. 1, the vacancy reaction (e.g., a dopant reaction) may be estimated in operation S70a of FIG. 6. In some example embodiments, operation S70a of FIG. 6 may be used to estimate a dopant concentration when the speed of the reaction between a dopant and the vacancy is fast. As shown in FIG. 6, operation S70a may include a plurality of operations S72a, S74a, and S76a. FIG. 6 is described with reference to FIG. 1.

Referring to FIG. 6, an initial dopant concentration may be obtained in operation S72a. Herein, the initial dopant concentration may refer to the concentration of a dopant (e.g., at least one of P, arsenic (As), boron (B), or carbon (C)) in a crystalline portion before the particle is incident to an integrated circuit. Crystal information D60 may include information (e.g., the profile of the dopant concentration) about the dopant concentration in the crystalline portion. As shown in FIG. 6, the initial dopant concentration may be obtained from the crystal information D60. The initial dopant concentration may be based on or modeled with, for example, other modeling techniques including TCAD techniques, and/or may be determined analytically with, for example, a secondary-ion mass spectrometry (SIMS) technique.

An equilibrium constant may be calculated in operation S74a. The equilibrium constant may represent a relationship among the dopant concentration of the crystalline portion, a vacancy concentration, and a combination concentration of the dopant and the vacancy. In some example embodiments, the equilibrium constant may depend on temperature. For example, the equilibrium constant, $K_D^{eq}$, may be calculated using Equation 4.

$$K_D^{eq} = k_D e^{-E_b/k_B T} \qquad \text{[Equation 4]}$$

In Equation 4, $k_D$ may be a prefactor of a dopant reaction, $E_b$ may be stabilization energy of a combination reaction between a dopant and a vacancy, $k_B$ may be Boltzmann's constant, and T may be a temperature, e.g. a temperature with respect to absolute zero. Herein, the equilibrium constant, $K_D^{eq}$, related to a dopant may be referred to as a first equilibrium constant.

The dopant concentration may be estimated in operation S76a. The estimated dopant concentration may refer to a dopant concentration that is changed from the initial dopant concentration because of the incident particle. In some example embodiments, the dopant concentration may be estimated based on the volume of the vacancy estimated in operation S50 in FIG. 1, the initial dopant concentration obtained in operation S72a, and the equilibrium constant (e.g., the first equilibrium constant) calculated in operation S74a. For example, the equilibrium constant, $K_D^{eq}$, may be defined as Equation 5.

$$K_D^{eq} = \frac{[DV]^l}{[D]^m [V]^n} \qquad \text{[Equation 5]}$$

In Equation 5, [D] may be a molar concentration of a dopant, [V] may be a molar concentration of a vacancy, [DV] may be a combination concentration of the dopant and the vacancy, and "l", "m", and "n" may be coefficients in a reaction equation of the dopant and the vacancy. The combination concentration, [DV], of the dopant and the vacancy may be obtained using Equation 5, and the dopant concentration may result from subtraction of the combination concentration, [DV], of the dopant and the vacancy from the initial dopant concentration. For example, a concentration $[D]_f$ of the dopant changed by the incident particle may be calculated using Equation 6 based on an initial dopant concentration $[D]_i$ and the combination concentration, [DV], of the dopant and the vacancy.

$$[D]_f = [D]_i - [DV] \qquad \text{[Equation 6]}$$

Figure 7:
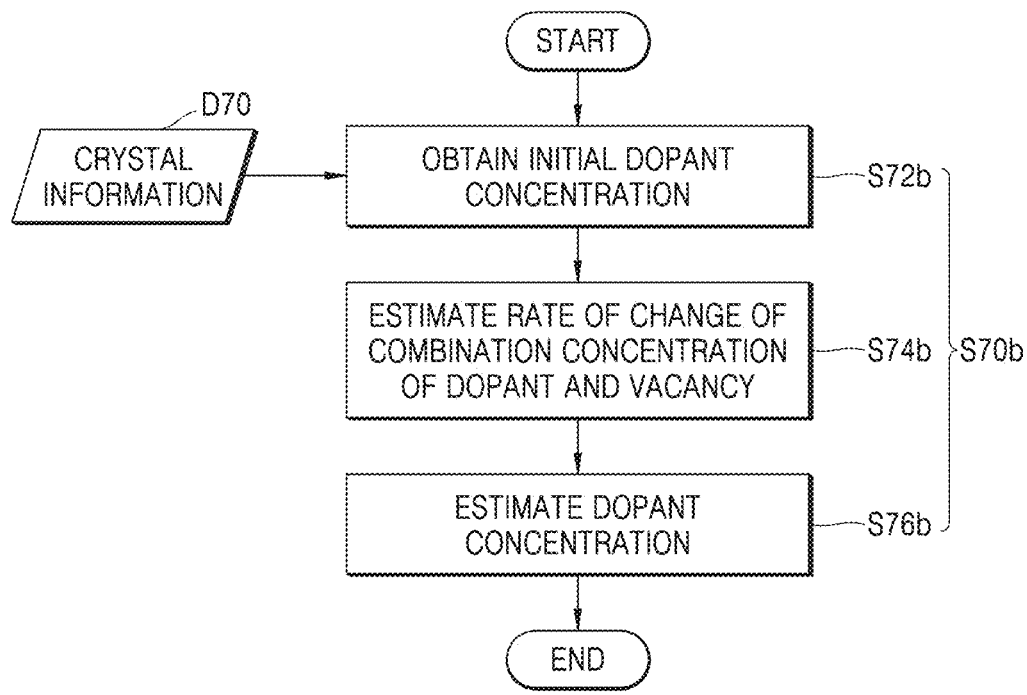
FIG. 7 is a flowchart of a method of modeling damages caused by incident particles, according to some example embodiments.

FIG. 7 is a flowchart of a method of modeling damages caused by incident particles, according to some example embodiments. In detail, the flowchart of FIG. 7 is an example of operation S70 in FIG. 1. As described above with reference to FIG. 1, the vacancy reaction (e.g., a dopant reaction) may be estimated in operation S70b of FIG. 7. In some example embodiments, operation S70b of FIG. 7 may be used to simulate the change in a dopant concentration over time. As shown in FIG. 7, operation S70b may include a plurality of operations S72b, S74b, and S76b. FIG. 7 is described with reference to FIG. 1.

Referring to FIG. 7, an initial dopant concentration may be obtained in operation S72b. Crystal information D70 may include information (e.g., the profile of a dopant concentration) about a dopant concentration in the crystalline portion. As shown in FIG. 7, the initial dopant concentration may be obtained from the crystal information D70.

A rate of change of the combination concentration of a dopant and the vacancy may be estimated in operation S74b. For example, the rate of change of the combination concentration of the dopant and the vacancy, d[DV]/dt, may be expressed as Equation 7.

$$\frac{d[DV]}{dt} = k'_D [D]^x [V]^y \qquad \text{[Equation 7]}$$

Accordingly, the combination concentration, [DV], of the dopant and the vacancy may be obtained as a function of time using Equation 7.

The dopant concentration may be estimated in operation S76b. In some example embodiments, the dopant concentration $[D]_f$ may be derived as a function of time using Equation 6 based on the initial dopant concentration $[D]_i$ and the combination concentration, [DV], of the dopant and the vacancy.

Figure 8:
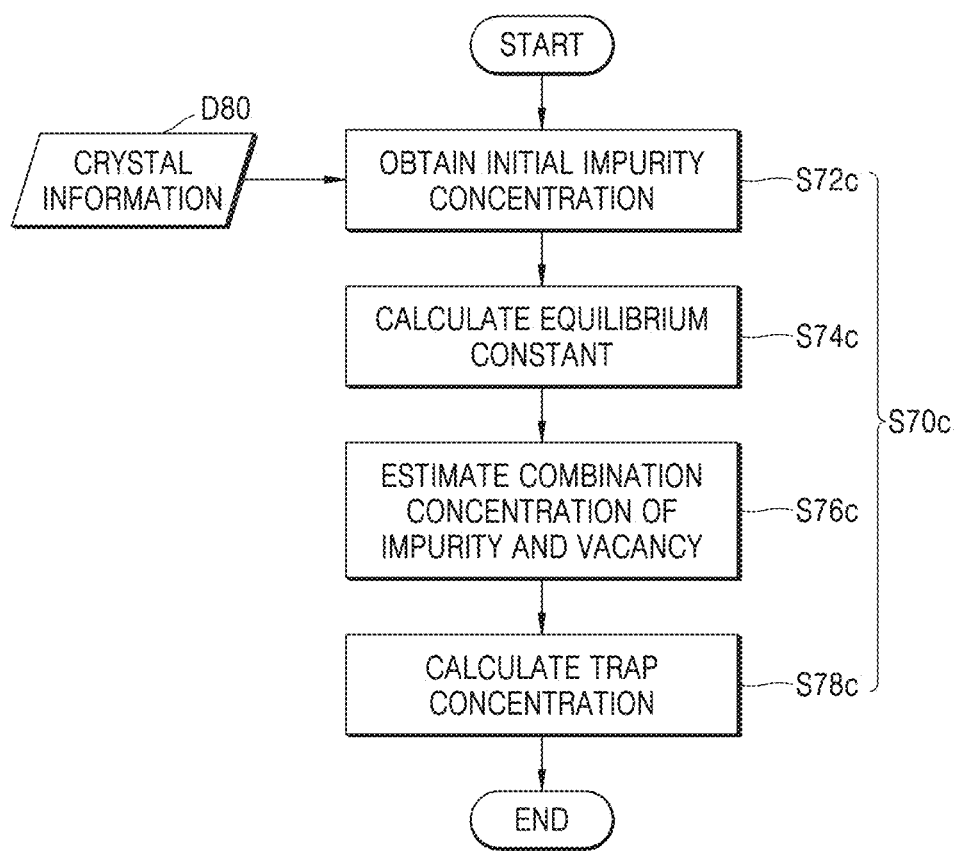
FIG. 8 is a flowchart of a method of modeling damages caused by incident particles, according to some example embodiments.

FIG. 8 is a flowchart of a method of modeling damages caused by incident particles, according to some example embodiments. In detail, the flowchart of FIG. 8 is an example of operation S70 in FIG. 1. As described above with reference to FIG. 1, the vacancy reaction (e.g., a dopant reaction) may be estimated in operation S70c of FIG. 8. In some example embodiments, operation S70c of FIG. 8 may be used to estimate a trap concentration when the speed of the reaction between an impurity and the vacancy is fast. As shown in FIG. 8, operation S70c may include a plurality of operations S72c, S74c, S76c, and S78c. FIG. 8 is described with reference to FIG. 1.

Referring to FIG. 8, an initial impurity concentration may be obtained in operation S72c. Herein, the initial impurity concentration may refer to the concentration of an impurity (e.g., at least one of carbon (C), oxygen (O), or nitrogen (N)) in a crystalline portion before the particle is incident to an integrated circuit. As used herein, an impurity may refer to an element that is not intended to be included in the crystalline or doped into the crystalline portion; rather, an impurity may refer to an element that remains within the crystalline portion. Crystal information D80 may include information (e.g., the profile of an impurity concentration) about an impurity concentration in the crystalline portion. As shown in FIG. 8, the initial impurity concentration may be obtained from the crystal information D80. A concentration of impurities may be less than, e.g. several orders of magnitude less than, a concentration of dopants; however, example embodiments are not limited thereto.

An equilibrium constant may be calculated in operation S74c. The equilibrium constant may represent a relationship among the impurity concentration of the crystalline portion, a vacancy concentration, and a combination concentration of the impurity and the vacancy. In some example embodiments, the equilibrium constant may depend on temperature. For example, the equilibrium constant, $K_I^{eq}$, may be calculated using Equation 8.

$$K_I^{eq} = k_f e^{-E_b/k_B T} \qquad \text{[Equation 8]}$$

In Equation 8, $k_f$ may be a prefactor of an impurity reaction, $E_b$ may be stabilization energy of a combination reaction between an impurity and a vacancy, $k_B$ may be Boltzmann's constant, and T may be a temperature, e.g. a temperature measured with respect to absolute zero. Herein, the equilibrium constant, $K_I^{eq}$, related to an impurity may be referred to as a second equilibrium constant.

A combination concentration of the impurity and the vacancy may be estimated in operation S76c. In some example embodiments, the combination concentration of the impurity and the vacancy may be estimated based on the volume of the vacancy estimated in operation S50 in FIG. 1 and the equilibrium constant (i.e., the second equilibrium constant) calculated in operation S74c. For example, the equilibrium constant $K_I^{eq}$ may be defined as Equation 9.

$$K_I^{eq} = \frac{[IV]^p}{[I]^q [V]^r} \qquad \text{[Equation 9]}$$

In Equation 9, [I] may be a molar concentration of an impurity, [V] may be a molar concentration of a vacancy, [IV] may be a combination concentration of the impurity and the vacancy, and "p", "q", and "r" may be coefficients in a reaction equation of the impurity and the vacancy. Accordingly, the combination concentration, [IV], of the impurity and the vacancy may be obtained using Equation 9.

A trap concentration may be calculated in operation S78c. A trap in the crystalline portion may depend on the combination between an impurity and a vacancy and the combination between a dopant and the vacancy. For example, a trap concentration $\text{Trap}_{concentration}$ may be expressed as Equation 10.

$$\text{Trap}_{concentration} = \sum_I [IV] + \sum_D [DV] \qquad \text{[Equation 10]}$$

On the right side of Equation 10, the first term may correspond to the sum of combination concentrations of respective impurities of a crystalline portion and a vacancy, and the second term may correspond to the sum of combination concentrations of respective dopants of the crystalline portion and the vacancy.

Figure 9:
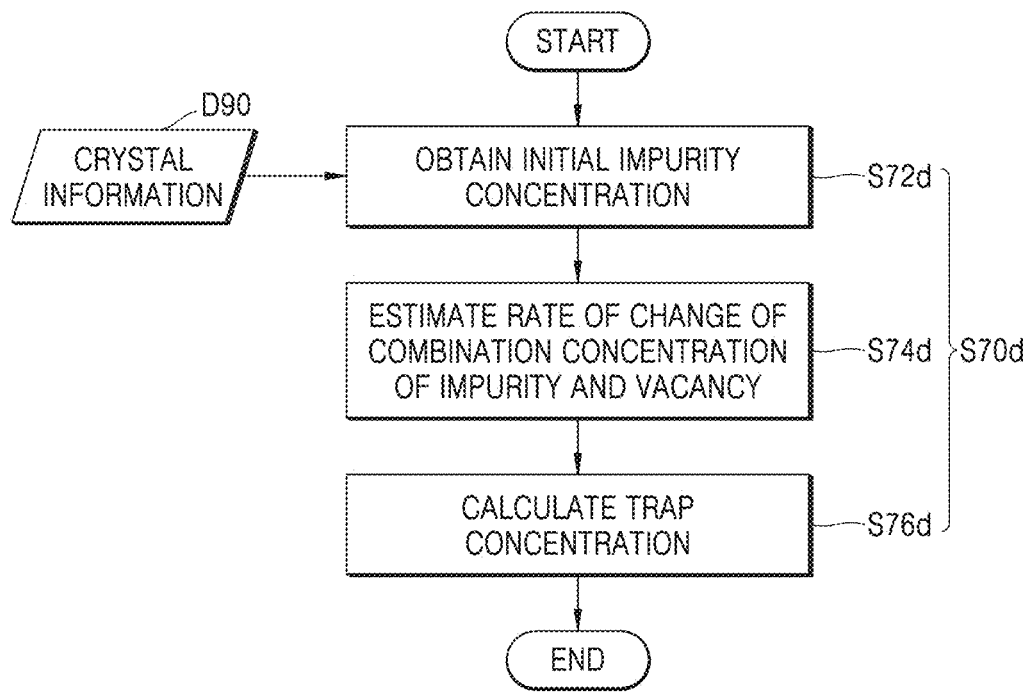
FIG. 9 is a flowchart of a method of modeling damages caused by incident particles, according to some example embodiments.

FIG. 9 is a flowchart of a method of modeling damages caused by incident particles, according to some example embodiments. In detail, the flowchart of FIG. 9 is an example of operation S70 in FIG. 1. As described above with reference to FIG. 1, the vacancy reaction (e.g., a dopant reaction) may be estimated in operation S70d of FIG. 9. In some example embodiments, operation S70d of FIG. 9 may be used to simulate the change in an impurity concentration over time. As shown in FIG. 9, operation S70d may include a plurality of operations S72d, S74d, and S76d. FIG. 9 is described with reference to FIG. 1.

Referring to FIG. 9, an initial impurity concentration may be obtained in operation S72d. Crystal information D90 may include information (e.g., the profile of an impurity concentration) about an impurity concentration in a crystalline portion. As shown in FIG. 9, the initial impurity concentration may be obtained from the crystal information D90.

A rate of change of the combination concentration of an impurity and the vacancy may be estimated in operation S74d. For example, the rate of change of the combination concentration of the impurity and the vacancy, d[IV]/dt, may be expressed as Equation 11.

$$\frac{d[DV]}{dt} = k'_D [D]^a [V]^b \qquad \text{[Equation 11]}$$

Accordingly, the combination concentration, [IV], of the impurity and the vacancy may be obtained as a function of time using Equation 11.

A trap concentration may be calculated in operation S76d. In some example embodiments, the trap concentration may be derived as a function of time using Equation 10 based on the combination concentration, [IV], of the impurity and the vacancy and the combination concentration, [DV], of a dopant and the vacancy.

Figure 10:
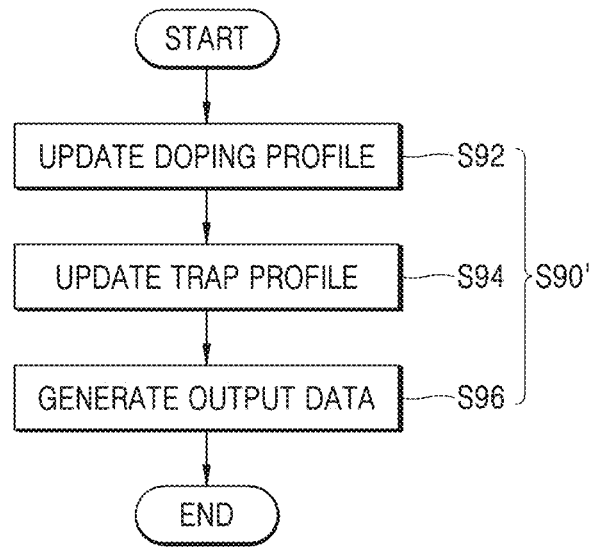
FIG. 10 is a flowchart of a method of modeling damages caused by incident particles, according to some example embodiments.

FIG. 10 is a flowchart of a method of modeling damages caused by incident particles, according to some example embodiments. In detail, the flowchart of FIG. 10 is an example of operation S90 in FIG. 1. As described above with reference to FIG. 1, the output data may be generated in operation S90' of FIG. 10. As shown in FIG. 10, operation S90' may include a plurality of operations S92, S94, and S96. In some example embodiments, operations S92 and S94 may be sequentially performed in a different order from that of FIG. 10, or may performed in parallel with each other. In some example embodiments, operation S92 or S94 may be omitted. FIG. 10 is described with reference to FIG. 1.

Referring to FIG. 10, a doping profile may be updated in operation S92. For example, as described above with reference to FIGS. 6 and 7, a doping concentration changed due to the incident particle may be estimated in operation S70 in FIG. 1. Doping concentrations may be estimated at different positions of the crystalline portion, and accordingly, the doping profile of the crystalline portion may be updated.

A trap profile may be updated in operation S94. For example, as described above with reference to FIGS. 8 and 9, a trap concentration caused by the incident particle may be estimated in operation S70 in FIG. 1. Trap concentrations may be estimated at different positions of the crystalline portion, and accordingly, the trap profile of the crystalline portion may be updated.

The output data may be generated in operation S96. For example, the output data may include the doping profile updated in operation S92 and/or the trap profile updated in operation S94. As described above with reference to FIG. 1, the output data may be used to design an integrated circuit that may be more robust to incident particles. An example of the output data will be described below with reference to FIG. 11.

Figure 11:
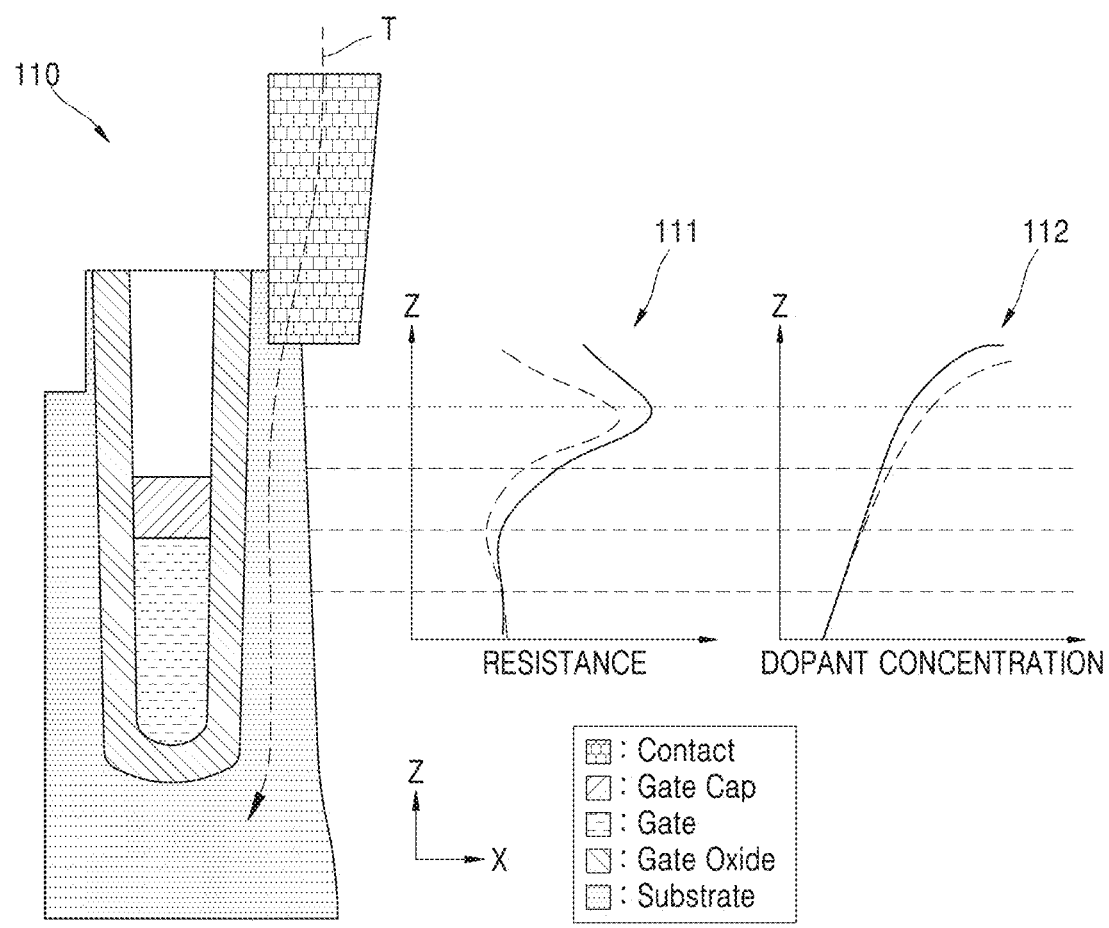
FIG. 11 is a diagram showing profiles of an integrated circuit, according to some example embodiments.

FIG. 11 is a diagram showing the profiles of an integrated circuit 110, according to some example embodiments. In detail, FIG. 11 illustrates a graph 111 showing the resistance of a substrate of the integrated circuit 110 on the Z axis and a graph 112 showing the dopant concentration of the substrate of the integrated circuit 110 on the Z axis. As described above with reference to FIG. 4, it is assumed that a particle is incident to the integrated circuit 110 along the track T.

Referring to the graph 111 in FIG. 11, the dashed line may represent the resistance profile of the substrate before the incidence of particles, and the solid line may represent the resistance profile of the substrate after the incidence of particles. According to the modeling method described above, the increase in resistance of the substrate due to incident particles may be simulated, and may be designed around and/or made robust to certain radiation damage caused by incident particles.

Referring to the graph 112 in FIG. 11, the dashed line may represent the dopant concentration profile 112 and/or the resistance 111 of the substrate before the incidence of particles, and the solid line may represent the dopant concentration profile 112 and/or the resistance 111 of the substrate after the incidence of particles. According to the modeling method described above, the decrease in dopant concentration of the substrate due to incident particles may be simulated.

Figure 12:
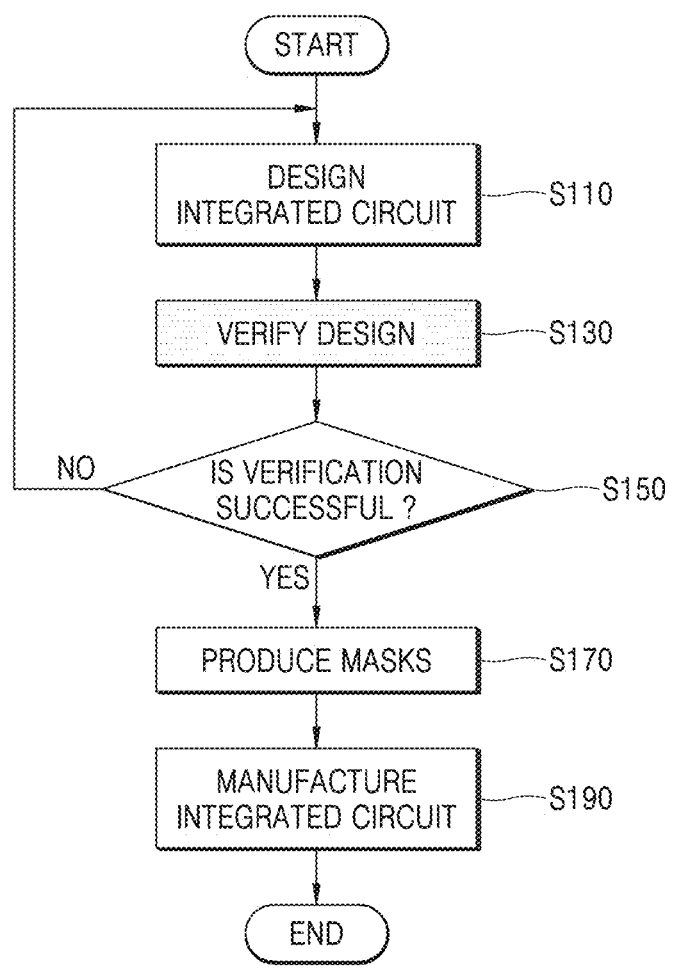
FIG. 12 is a flowchart of a method of manufacturing an integrated circuit.

FIG. 12 is a flowchart of a method of manufacturing an integrated circuit. The method of modeling damages caused by incident particles, which has been described above with reference to the accompanying drawings, may be included in the method of manufacturing an integrated circuit. As shown in FIG. 12, the method of manufacturing or fabricating an integrated circuit may include a plurality of operations S110, S130, S150, S170, and S190.

Referring to FIG. 12, an integrated circuit may be designed in operation S110. In some example embodiments, the integrated circuit may be designed based on required or desired specifications. For example, a memory device may include memory cells designed to meet or exceed a required or desired capacity, and a processor processing digital signals may include standard cells designed to meet a required speed and/or power consumption. The integrated circuit may be designed using an electronic design automation (EDA) program, and data, e.g., design data, which defines the designed integrated circuit, may be generated.

The design of the integrated circuit may be verified in operation S130. Whether the verification is successful may be determined in operation S150. When the verification is successful, operation S170 may be subsequently performed. When the verification fails, operation S110 may be iterated ro repeated. The integrated circuit designed in operation S110 may be simulated for various purposes in operation S130, and whether a simulation result satisfies the specifications may be determined. When the accuracy of a simulation is low, the verification of good design may fail or the verification of bad design may be successful. Therefore, when the accuracy of a simulation is low, a design period for an integrated circuit may be prolonged, and/or a bad integrated circuit may be manufactured. In some example embodiments, the method of modeling damages caused by incident particles, which has been described above with reference to the accompanying drawings, may be performed in operation S130. Accordingly, damage to an integrated circuit because of incident particles may be more easily and/or accurately simulated, and vulnerability or robustness of the integrated circuit to incident particles may be determined and designed around and/or may be made robust. As a result, a design period for an integrated circuit may be reduced, and/or the yield and/or reliability of the integrated circuit may be increased.

When the verification of the design of the integrated circuit is successful, masks or photomasks may be produced in operation S170. The integrated circuit may be manufactured by semiconductor processes including a plurality of sub-processes, and some of the sub-processes may use masks. Each mask may be produced based on the structure of the integrated circuit. In some example embodiments, mask patterns may be defined based on optical proximity correction (OPC) for correcting distortion, such as refraction, caused by the characteristics of light in photolithography; however, example embodiments are not limited thereto.

Example embodiments are not limited to the use of the modeling of cosmic ray damage in the design verification and mask generation of semiconductor devices. For example, the modeling of damage may be used to characterize other aspects of semiconductor fabrication. For example, the output data generated in step S96 of FIG. 10 may be used in the design of masks, and/or may be used in the modeling of various processes and sub-processes used in fabrication of semiconductor devices, and/or may be used in tandem with the fabrication of semiconductor devices. For example, in addition to or alternatively to designing at least one mask based on the modeling of damages, some example embodiments also may involve processing the semiconductor device based on the modeling of damages. For example, at least one process variable such as at least one of a time or temperature of an annealing step may be determined based on the output data. Alternatively or additionally, at least one of a voltage or a current used in the fabrication of a semiconductor device may be based on the output data. Alternatively or additionally, at least one of an implant dose or an implant energy may be based on the output data. For example, a change in at least one of an implant dose or an implant energy may lead to a change in an initial dopant concentration, which may lead to a change in a total dopant concentration even in the presence of damage caused by cosmic rays. A relation between an initial dopant concentration and a total dopant concentration may be modeled and/or simulated and/or determined according to some example embodiments. Similar concrete actions based on the output data may be performed. By using the output data to design the semiconductor device and/or to fabricate the semiconductor device, a time to design and/or a yield and/or a reliability of the semiconductor device may be improved.

The integrated circuit may be manufactured in operation S190. A plurality of layers may be patterned using the masks produced in operation S170, and accordingly, the integrated circuit may be manufactured. For example, front-end-of-line (FEOL) may include planarizing and/or cleaning a wafer, forming a trench, forming a well, forming a gate electrode, and forming a source and a drain. Individual devices, e.g., transistors, capacitors, resistors, etc., may be formed in a substrate via the FEOL. Back-end-of-line (BEOL) may include silicidation of a gate and/or of source and drain regions, adding a dielectric, planarization, forming a hole, adding a metal layer, forming a via, and forming a passivation layer; however, example embodiments are not limited thereto. The individual devices, e.g., transistors, capacitors, resistors, etc., may be interconnected with each other via the BEOL. In some example embodiments, middle-of-line (MOL) processes may be performed between FEOL and BEOL such that contacts may be formed on individual devices.

Figure 13:
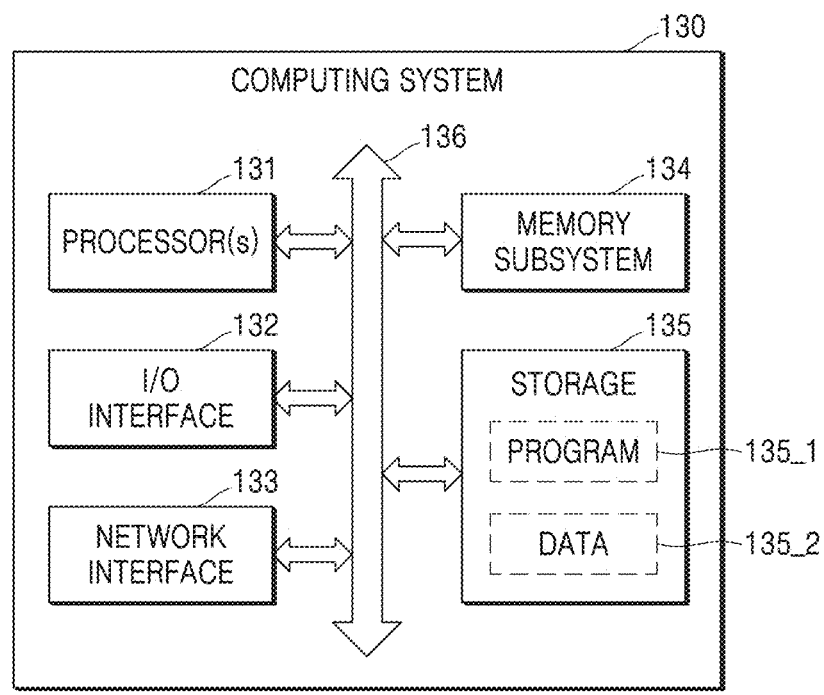
FIG. 13 is a block diagram of a computing system according to some example embodiments.

FIG. 13 is a block diagram of a computing system 130 according to some example embodiments. In some example embodiments, the method of modeling damages caused by incident particles, which has been described above with reference to the accompanying drawings, may be performed by the computing system 130 of FIG. 13.

The computing system 130 may include a stationary computing system, such as a desktop computer, a workstation, or a server, or a portable computing system such as a laptop computer. Referring to FIG. 13, the computing system 130 may include at least one processor 131, an input/output (I/O) interface 132, a network interface 133, a memory subsystem 134, and a storage 135. The at least one processor 131, the I/O interface 132, the network interface 133, the memory subsystem 134, and the storage 135 may communicate with one another through a bus 136.

The at least one processor 131 may be referred to as a processing unit and may execute an instruction set (e.g., Intel architecture (IA)-32, 64-bit extension IA-32, x86-64, PowerPC, Sparc, and/or microprocessor without interlocked pipeline stages (MIPS), advanced reduced instruction set computer (RISC) machine (ARM), and/or IA-64), like a microprocessor, an application processor (AP), a digital signal processor (DSP), a graphics processing unit (GPU), or the like. For example, the at least one processor 131 may access the memory subsystem 134 through the bus 136 and execute instructions stored in the memory subsystem 134.

The I/O interface 132 may include an input device, such as a keyboard or a pointing device, and/or an output device such as a display device or a printer, or may provide access to an input device and/or an output device. A user may trigger execution of a program 135_1 and/or loading of data 135_2 through the I/O interface 132, input the particle information and/or the crystal information in FIG. 1, or check the output data in FIG. 1.

The network interface 133 may provide access to a network outside the computing system 130. For example, the network may include a plurality of computing systems and communication links. The communication links may include at least one of wired links, optical links, wireless links, and/or other types of links.

The memory subsystem 134 may store the program 135_1 for the method of modeling damages caused by incident particles, which has been described above with reference to the accompanying drawings, or at least part of the program 135_1. The at least one processor 131 may perform at least part of the method of modeling damages caused by incident particles by executing a program (or instructions) stored in the memory subsystem 134. The memory subsystem 134 may include ROM, RAM, and/or the like.

The storage 135 as a non-transitory storage medium may not lose data stored therein even when power supplied to the computing system 130 is interrupted. For example, the storage 135 may include a non-volatile memory device or a storage medium such as a magnetic tape, an optical disk, or a magnetic disk. The storage 135 may be detachable from the computing system 130. As shown in FIG. 13, the storage 135 may store the program 135_1 and the data 135_2. The program 135_1 is executed by the at least one processor 131, at least part of the program 135_1 may be loaded to the memory subsystem 134 before being executed. In some example embodiments, the storage 135 may store a file written in program language. The program 135_1, which is generated from the file by a compiler or the like, or at least part of the program 135_1 may be loaded to the memory subsystem 134. The data 135_2 may include data, e.g., the particle information and/or the crystal information in FIG. 1, needed to perform the method of modeling damages caused by incident particles, which has been described above with reference to the accompanying drawings. The data 135_2 may also include data, e.g., the output data in FIG. 1, generated by performing the method of modeling damages caused by incident particles, which has been described above with reference to the accompanying drawings.

As used herein, at least some of the elements described herein may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to some example embodiments thereof, it will be understood that various changes in form and details may be made therein without departing from the spirit and scope of the following claims.

What is claimed is:

1. A method of modeling damages to a crystal caused by an incident particle, the method comprising:
    obtaining particle information and crystal information;
    estimating energy loss of the incident particle based on the particle information and on the crystal information;
    estimating a volume of a vacancy based on the energy loss;
    estimating a vacancy reaction based on the crystal information and on the volume of the vacancy; and
    generating output data based on the vacancy reaction, the output data including quantification data of the damages to verify design of integrated circuit before fabrication.

2. The method of claim 1, wherein the estimating of the volume of the vacancy includes:
    estimating a first volume of the vacancy caused by the energy loss;
    estimating a second volume caused by diffusion of the vacancy; and
    calculating the volume of the vacancy based on a sum of the first volume and the second volume.

3. The method of claim 2, wherein the estimating of the first volume includes calculating the first volume based on a polynomial of the energy loss.

4. The method of claim 3, wherein the polynomial includes a 3rd order polynomial of the energy loss.

5. The method of claim 2, wherein the estimating of the second volume includes calculating the second volume based on a diffusivity of the vacancy and on a lifetime of the vacancy.

6. The method of claim 5, wherein the calculating of the second volume includes calculating the second volume based on the equation:

$$\text{Vol}_{diffusion} = A \times (\sqrt{D_V \times \tau_{lifetime}})^3,$$

wherein $\text{Vol}_{diffusion}$ is the second volume, A is a constant, $D_V$ is the diffusivity of the vacancy, and $\tau_{lifetime}$ is the lifetime of the vacancy.

7. The method of claim 1, wherein the estimating of the vacancy reaction includes:
    obtaining an initial dopant concentration from the crystal information;
    calculating a first equilibrium constant based on the crystal information; and
    estimating a dopant concentration based on the initial dopant concentration, the volume of the vacancy, and the first equilibrium constant.

8. The method of claim 1, wherein the estimating of the vacancy reaction includes:
    obtaining an initial dopant concentration from the crystal information;
    calculating a rate of change of a combination concentration of a dopant and the vacancy, the calculating the rate of change based on the initial dopant concentration and on the volume of the vacancy; and estimating a dopant concentration based on the initial dopant concentration and on the combination concentration of the dopant and the vacancy.

9. The method of claim 1, wherein the estimating of the vacancy reaction includes:
obtaining an initial impurity concentration from the crystal information;
calculating a second equilibrium constant based on the crystal information;
estimating a combination concentration of an impurity and the vacancy, the estimating the combination concentration based on the initial impurity concentration, the volume of the vacancy, and the second equilibrium constant; and
calculating a trap concentration based on a sum of (A) a combined concentration of a dopant and the vacancy and (B) the combination concentration of the impurity and the vacancy.

10. The method of claim 1, wherein the estimating of the vacancy reaction includes:
extracting an initial impurity concentration from the crystal information;
calculating a rate of change of a combination concentration of an impurity and the vacancy, the calculating the rate of change based on the initial impurity concentration and on the volume of the vacancy; and
calculating a trap concentration based on a sum of (A) a combination concentration of a dopant and the vacancy and (B) the combination concentration of the impurity and the vacancy.

11. A method of manufacturing an integrated circuit, the method comprising:
producing at least one mask based on design data, the design data verified based on the output data of claim 1; and
manufacturing the integrated circuit using the at least one mask.

12. A system comprising:
at least one processor; and
a non-transitory storage medium storing instructions that, when executed by the at least one processor, cause the at least one processor to perform operations for modeling damages to a crystal caused by an incident particle,
wherein the operations comprise,
obtaining particle information and crystal information,
estimating energy loss of the incident particle based on the particle information and on the crystal information,
estimating a volume of a vacancy based on the energy loss,
estimating a vacancy reaction based on the crystal information and on the volume of the vacancy, and
generating output data based on the vacancy reaction, the output data including quantification data of the damages to verify design of integrated circuit before fabrication.

13. The system of claim 12, wherein the estimating the volume of the vacancy includes:
estimating a first volume of the vacancy caused by the energy loss;
estimating a second volume caused by diffusion of the vacancy; and
calculating the volume of the vacancy based on a sum of the first volume and the second volume.

14. A method of modeling damages to a crystal caused by an incident particle, the method comprising:

obtaining particle information and crystal information;
estimating energy loss of the incident particle based on the particle information and on the crystal information;
estimating a volume of a vacancy based on the energy loss,
wherein the estimating of the volume of the vacancy includes,
estimating a first volume of the vacancy caused by the energy loss,
estimating a second volume caused by diffusion of the vacancy, and
calculating the volume of the vacancy based on a sum of the first volume and the second volume;
estimating a vacancy reaction based on the crystal information and on the volume of the vacancy; and
generating output data based on the vacancy reaction, the output data including quantification data of the damages to verify design of integrated circuit before fabrication.

15. The method of claim 14, wherein the estimating of the second volume includes calculating the second volume based on a diffusivity of the vacancy and on a lifetime of the vacancy.

16. The method of claim 14, further comprising:
estimating a vacancy reaction based on the crystal information and on the volume of the vacancy; and
generating output data based on the vacancy reaction, the output data including quantification data of the damages.

17. The method of claim 16, wherein the estimating of the vacancy reaction includes:
obtaining an initial dopant concentration from the crystal information;
calculating a first equilibrium constant based on the crystal information; and
estimating a dopant concentration based on the initial dopant concentration, the volume of the vacancy, and the first equilibrium constant.

18. The method of claim 16, wherein the estimating of the vacancy reaction includes:
obtaining an initial dopant concentration from the crystal information;
calculating a rate of change of a combination concentration of a dopant and the vacancy based on the initial dopant concentration and the volume of the vacancy; and
estimating a dopant concentration based on the initial dopant concentration and the combination concentration of the dopant and the vacancy.

19. The method of claim 16, wherein the estimating of the vacancy reaction includes:
obtaining an initial impurity concentration from the crystal information;
calculating a second equilibrium constant based on the crystal information;
estimating a combination concentration of an impurity and the vacancy based on the initial impurity concentration, the volume of the vacancy, and the second equilibrium constant; and
calculating a trap concentration based on a sum of (A) a combination concentration of a dopant and the vacancy and (B) the combination concentration of the impurity and the vacancy.

20. The method of claim 16, wherein the estimating of the vacancy reaction includes:
obtaining an initial impurity concentration from the crystal information;

calculating a rate of change of a combination concentration of an impurity and the vacancy based on the initial impurity concentration and the volume of the vacancy; and calculating a trap concentration by summing a combination concentration of a dopant and the vacancy and the combination concentration of the impurity and the vacancy.

\* \* \* \* \*